(12) United States Patent
Lassahn et al.

(10) Patent No.: US 10,127,624 B1
(45) Date of Patent: Nov. 13, 2018

(54) BLOCK MAPPING IN HIGH EFFICIENCY VIDEO CODING COMPLIANT ENCODERS AND DECODERS

(71) Applicant: Amazon Technologies, Inc., Reno, NV (US)

(72) Inventors: Jeffrey K. Lassahn, Portland, OR (US); Timothy B. Prins, Hillsboro, OR (US)

(73) Assignee: Amazon Technologies, Inc., Reno, NV (US)

( * ) Notice: Subject to any disclaimer, the term of this patent is extended or adjusted under 35 U.S.C. 154(b) by 665 days.

(21) Appl. No.: 13/756,960

(22) Filed: Feb. 1, 2013

Related U.S. Application Data

(60) Provisional application No. 61/747,076, filed on Dec. 28, 2012.

(51) Int. Cl.
| | | |
|---|---|---|
| *G06F 12/00* | (2006.01) | |
| *G06T 1/20* | (2006.01) | |
| *G06F 12/02* | (2006.01) | |
| *G11C 8/00* | (2006.01) | |

(52) U.S. Cl.
CPC ............. *G06T 1/20* (2013.01); *G06F 12/00* (2013.01); *G06F 12/02* (2013.01); *G11C 8/00* (2013.01)

(58) Field of Classification Search
CPC .......... G06F 15/16; G06F 12/00; G06F 15/00; H04N 7/28; H04N 7/00; G11C 8/00
See application file for complete search history.

(56) References Cited

U.S. PATENT DOCUMENTS

| | | | |
|---|---|---|---|
| 2003/0163718 A1* | 8/2003 | Johnson | G06F 12/1408 713/193 |
| 2004/0234144 A1* | 11/2004 | Sugimoto | H04N 19/176 382/239 |
| 2008/0162713 A1* | 7/2008 | Bowra | H04N 21/4344 709/231 |
| 2009/0003447 A1* | 1/2009 | Christoffersen | H04N 19/61 375/240.16 |
| 2010/0329329 A1* | 12/2010 | Reznik | G06F 17/147 375/240.2 |

* cited by examiner

*Primary Examiner* — Maryam A Nasri
(74) *Attorney, Agent, or Firm* — Hogan Lovells US LLP

(57) ABSTRACT

An apparatus includes a central processing unit and a parallel processing unit. The parallel processing unit includes an array of software-configurable general purpose processors, a globally-shared memory, and a shared memory. Each of the software-configurable general purpose processors in the array of software-configurable general purpose processors has access to the globally-shared memory to execute one or more portions of at least one of (i) a decoding program, (ii) an encoding program, and (iii) an encoding and decoding program. The shared memory is accessible by the central processing unit to program the shared memory with a map array describing a position of block data in one or more associated arrays.

15 Claims, 6 Drawing Sheets

BLOCK MAPPING IN HIGH EFFICIENCY VIDEO CODING COMPLIANT ENCODERS AND DECODERS

This application claims the benefit of U.S. Provisional Application No. 61/747,076, filed Dec. 28, 2012, and is hereby incorporated by reference in its entirety.

FIELD OF THE INVENTION

The present invention relates to video compression generally and, more particularly, to a method and/or architecture for block mapping in High Efficiency Video Coding (HEVC) compliant encoders and decoders.

BACKGROUND OF THE INVENTION

High Efficiency Video Coding (HEVC) decoders and encoders need to maintain large amounts of data for rectangular blocks of pixels of varying sizes. There are two different types of pixel blocks: Transform Units and Coding Units, with each pixel of an image belonging to one Transform Unit and one Coding Unit.

It would be desirable to implement a method and/or architecture for block mapping in high efficiency video coding (HEVC) compliant encoders and decoders.

SUMMARY OF THE INVENTION

The present invention concerns an apparatus including a central processing unit and a parallel processing unit. The parallel processing unit includes an array of software-configurable general purpose processors, a globally-shared memory, and a shared memory. Each of the software-configurable general purpose processors in the array of software-configurable general purpose processors has access to the globally-shared memory to execute one or more portions of at least one of (i) a decoding program, (ii) an encoding program, and (iii) an encoding and decoding program. The shared memory is accessible by the central processing unit to program the shared memory with a map array describing a position of block data in one or more associated arrays.

The objects, features and advantages of the present invention include providing a method and/or architecture for block mapping in high efficiency video coding (HEVC) compliant encoders and decoders that may (i) provide a total size of stored data that is much smaller than if all data was stored at the resolution of the minimum coding unit, (ii) reduce memory use and reduce time required to transmit data between a central processing unit (CPU) and a parallel processing unit (PPU), e.g., a graphics processing unit (GPU), (iii) provide a map at a fixed resolution, that facilitates locating data for a block at a particular position, (iv) make locating data for a block at a particular position much faster than if the block arrays were searched directly, (v) speed up many common operations needed for HEVC encoding and decoding, (vi) pack each of three data arrays as a contiguous region of memory, (vii) provide for efficient copying of data between the CPU and the PPU, (viii) allow later steps in encoding or decoding processes to look up data in any order once the map is constructed, (ix) prevent neighbor data dependencies between the blocks from serializing processing of the blocks, and/or (x) allow many block level operations to be performed in parallel on the PPU.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Embodiments of the present invention include a method and/or apparatus for efficiently storing and accessing data for High Efficiency Video Coding (HEVC) Code Tree Blocks (CTBs), Coding Units (CUs) and Transform Units (TUs). Embodiments of the present invention generally facilitate fast access to the data by a decoding process and/or an encoding process, and allow the decoding process and/or encoding process to be efficiently divided (partitioned) into parallel operations.

High Efficiency Video Coding (HEVC) compliant decoders and encoders need to maintain large amounts of data for rectangular blocks of pixels of varying sizes. There are two different types of pixel blocks: transform units (TUs) and coding units (CUs). Each pixel of each image belongs to one transform unit and one coding unit. Embodiments of the invention generally provide a method for organizing the block data so that the block data can be easily moved between a central processing unit (CPU) and a parallel processing unit (PPU), and so that the data can be efficiently accessed by parallel algorithms. The parallel processing unit may be implemented using a graphics processing unit (GPU), a parallel processor array (PPA), or any other arrangement of data processing capability for performing parallel algorithms.

A decoder typically builds the data structure in accordance with an embodiment of the present invention serially, as the decoder parses the input bitstream. The decoder then may copy the data to a PPU, PPA, GPU, etc., where the data blocks can be processed in parallel. In some embodiments, an encoder may build the data structure in accordance with an embodiment of the present invention in parallel on a PPU, PPA, GPU, etc. In other embodiments, an encoder may build one or more preliminary versions of the data structure in accordance with an embodiment of the present invention on the PPU, PPA, GPU, etc., and then refine the one or more preliminary versions by analysis on the CPU. The encoder then converts the data into an ordered serial list for generating the output bitstream.

Figure 1:
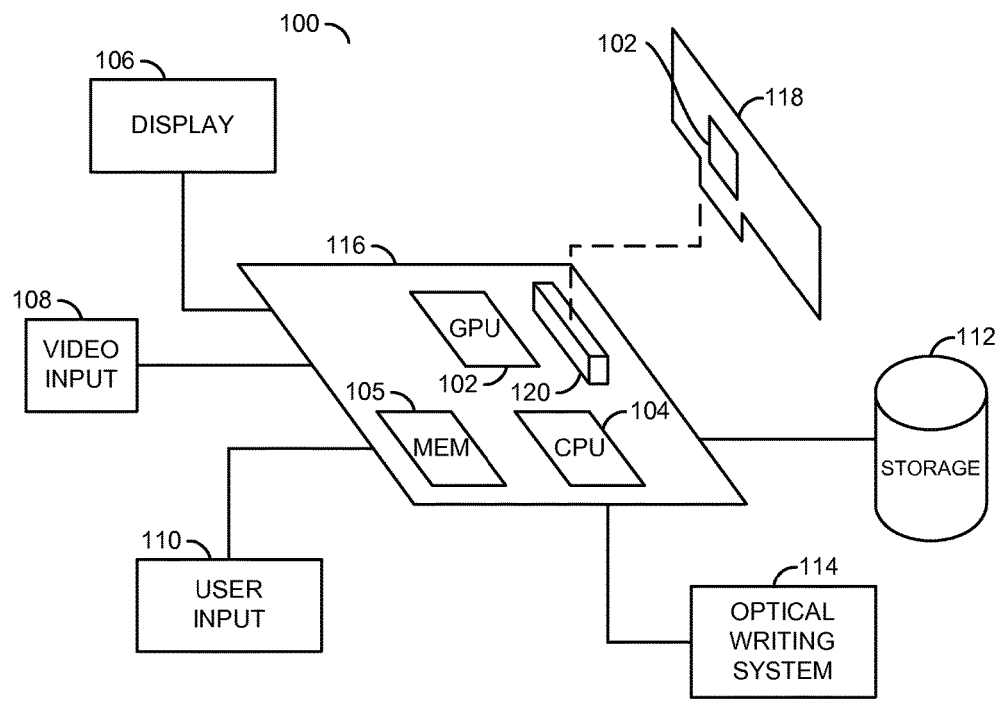
FIG. 1 is a block diagram illustrating a system for implementing an encoder and/or decoder in accordance with embodiments of the present invention.

Referring to FIG. 1, a block diagram of a system 100 is shown illustrating a context for implementing an encoder and/or decoder in accordance with embodiments of the invention. In one example, an embodiment of the invention may be implemented as a computer system 100 including both a parallel (e.g., graphics) processing unit (GPU) 102 and a central processing unit (CPU) 104. The system 100 may also include, but is not limited to, a system memory 105, an output device (e.g., display, monitor, etc.) 106, a video input module 108, an user input device (e.g., keyboard, mouse, etc.) 110, a storage device (e.g., hard drive, non-volatile memory, etc.) 112 and an optical disc writing system 114. In another example, an embodiment of the invention may implement a method for the decompressing frames of video from an encoded (e.g., H.264, H.HEVC, etc.) bitstream using (i) a parallel (e.g., graphics) processing unit that includes many parallel stream processors configured in an array and (ii) a CPU to perform some of the steps (e.g., entropy/syntax decoding, etc.) in the decompression.

The GPU 102 may be implemented, in one example, as a device (e.g., from NVIDIA, AMD, INTEL, etc.) mounted either on a motherboard 116 or on a card 118 that connects to the motherboard 116 (e.g., via a connector 120). The GPU 102 may comprise, in one example, a plurality of software-programmable general purpose parallel processors on one device. The GPU 102 may be configured to process data in parallel using the plurality of software-programmable general purpose parallel processors. The CPU 104 may be implemented as one or more sequential processors (or cores) mounted on the motherboard 116 (e.g., via a socket). Encoder and decoder (e.g., H.264, H.HEVC, etc.) instances may be implemented that take advantage of the parallel processors and the sequential processors by efficiently partitioning the encoder and decoder instances across the processor sets. The system 100 is generally configured to generate a number of arrays (described in more detail below in connection with FIG. 3).

Figure 2:
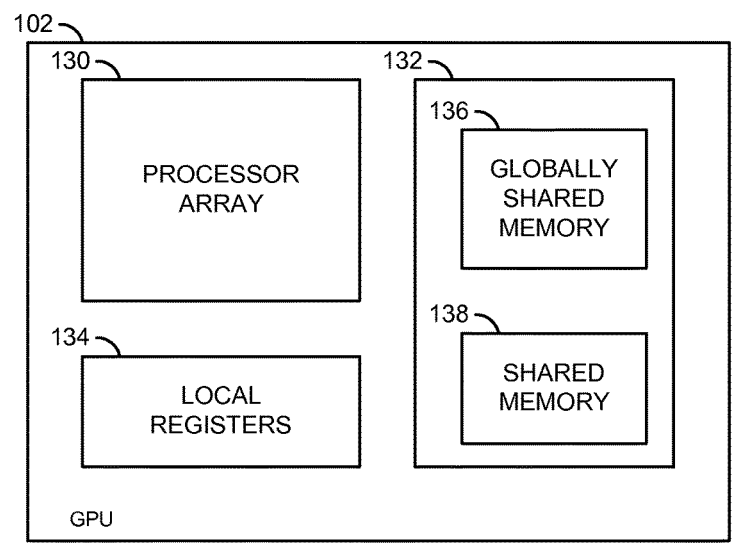
FIG. 2 is a diagram illustrating an example embodiment of a parallel (e.g., graphics) processing unit of FIG. 1.

Referring to FIG. 2, a diagram is shown illustrating an example implementation of the GPU 102 of FIG. 1 in accordance with an embodiment of the invention. In one example, the GPU 102 may comprise an array of software-programmable general purpose parallel processors 130, a memory 132, and a plurality of local registers 134. The memory 132 may comprise a first portion 136 and a second portion 138. The portion 136 may implement a globally shared memory. The portion 138 may implement a shared memory. The shared memory 138 is generally implemented with faster memory than the globally shared memory 136. Each of the processors in the parallel processor array 130 may have access to the globally shared memory 136, a portion of the shared memory 136 and a number of the local registers 134. In one example, a subset (or block) of the processors in the parallel processor array 130 (e.g., 8) may share a respective portion of the shared memory 138. In general, the GPU 102 may be configured to efficiently carry out the same computation on parallel data sets. The CPU 104 may be configured to provide serial processing where serial computations are completed very quickly. In one example, the CPU 104 may be configured to decode syntax elements of a picture contained in an encoded bitstream, generate a number of arrays (e.g., a transform unit array, a coding unit array, and a map array) of the picture, and transfer the arrays to the GPU 102 for processing blocks of the picture in parallel on the GPU 102.

In one example, the GPU 102 may be implemented with an NVIDIA device. A general purpose parallel computing architecture such as NVIDIA® CUDA™ may be used to leverage the parallel compute engine in the NVIDIA GPU to solve many complex computational problems in a fraction of the time taken on a CPU. NVIDIA and CUDA are trademarks of NVIDIA Corporation, 2701 San Tomas Expressway, Santa Clara, Calif. 95050. The general purpose parallel computing architecture may include a CUDA™ Instruction Set Architecture (ISA) and the parallel compute engine in the GPU. To program to the CUDA™ architecture, a developer may, for example, use C, one of the most widely-used, high-level programming languages, which can then be run on a CUDA™ enabled processor. Other languages may be supported in the future, including FORTRAN and C++.

A GPU program may be referred to as a "kernel". A GPU implemented with the NVIDIA device may be configured in 1 or 2 dimensional blocks of threads called CUDA blocks. The CUDA blocks may be configured in a grid of CUDA blocks when a kernel is launched. Three resources may be optimized for any given launch of a kernel: number of registers used, number of threads per block, and amount of shared memory used for each CUDA block.

Figure 3:
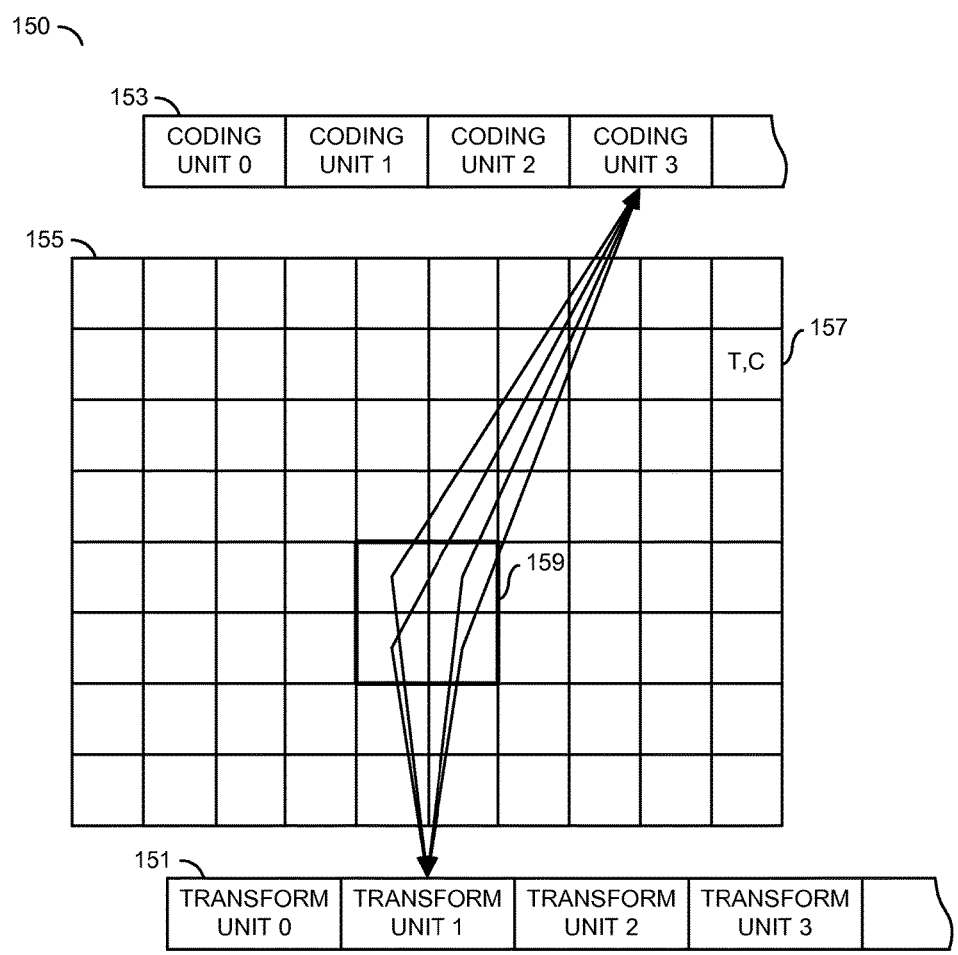
FIG. 3 is a diagram illustrating an array of indices in accordance with an embodiment of the present invention.

Referring to FIG. 3, a diagram is shown illustrating a data structure 150 in accordance with an embodiment of the invention. In various embodiments, the data structure 150 organizes data as three arrays: an array of transform units (e.g., transform unit array 151); an array of coding units (e.g., coding unit array 153); and a map array 155. Each element (or transform unit) in the transform unit array 151 represents a variable sized rectangle of image pixels and contains information about the transform settings and coefficients representing those pixels. Each element (or coding unit) in the coding unit array 153 represents a variable sized rectangle of image pixels and contains information about the prediction and coding mode of those pixels. Each element 157 of the map array 155 represents a small fixed size square of image pixels (e.g., 4×4 pixels). Each element 157 of the map array 155 contains two indices (e.g., T and C). A first index (e.g., T) specifies which element in the transform unit array 151 covers the corresponding pixels. A second index (e.g., C) specifies which element in the coding unit array 153 is associated with the corresponding pixels. Each element 157 in the map array 155 is the size of a minimum coding unit. A group of map array elements (e.g., shown by outline 159) may be covered, for example, by a single element of the transform unit array 151 and/or the coding unit array 153.

The number of transform units (TUs) and coding units (CUs) in an image is generally not known until the data structure 150 is complete. Thus, determining which index in the transform unit array 151 or coding unit array 153 represents which parts of the image directly is a difficult, serial problem (task). The size and organization of the map array 155, however, depends only on the dimensions of the image. Thus, the map array 155 can be easily accessed by parallel image processing algorithms. The indices in each element of the map array 155 then allow the parallel algorithms to locate data in the transform unit array 151 and the coding unit array 153. Only the map array 155 needs to be organized in a particular order. The transform unit array 151 and the coding unit array 153 can have elements arranged in an arbitrary order. The map array 155 allows parallel code operating on single blocks to create or read the transform unit array 151 and coding unit array 152 without any order dependencies or serialization requirements.

Even though the data is of variable size, the data may be efficiently packed into the three contiguous arrays. Each array can be efficiently copied between processors (e.g. from CPU to GPU, GPU to CPU, etc.). The use of indices rather than pointers inside the map array 155 means the data for the map remains valid after the map is copied to another location. Data relating to each transform unit element or coding unit element is kept in the transform unit array 151 or coding unit array 153, respectively. Each element in the transform unit array 151 and coding unit array 153 represents a variable sized region (e.g., square, rectangular, etc.) of the image being encoded or decoded. The map array 155 provides a two dimensional array that acts as a map describing the position of each block. The map array 155 is stored at the minimum prediction unit (PU) size or the minimum transform unit (TU) size (e.g., 4×4 pixels), whichever is smaller, and contains indices into the transform unit array 151 and the coding unit array 153.

The data structure 150 in accordance with an embodiment of the invention has several advantages. The total size of the stored data using the data structure 150 is much smaller than if all data was stored at the resolution of the smaller of the minimum prediction unit or the minimum transform unit. This reduces memory use and reduces time required to transmit the data between a CPU and a GPU. Because the map is at a fixed resolution, locating the data for a block at a particular position is much faster than if the block arrays were searched directly. This speeds up many common operations needed for HEVC encoding and decoding, such as neighbor data fetching. Each of the three data arrays is packed as a contiguous region of memory, so the data can be copied efficiently between the CPU and the GPU. Once the map is constructed, all later steps in the encoding and/or decoding processes can look up data in any order, so neighbor data dependencies between the blocks do not serialize processing of the blocks. This allows many block level operations to be performed in parallel on the parallel processing unit.

Figure 4:
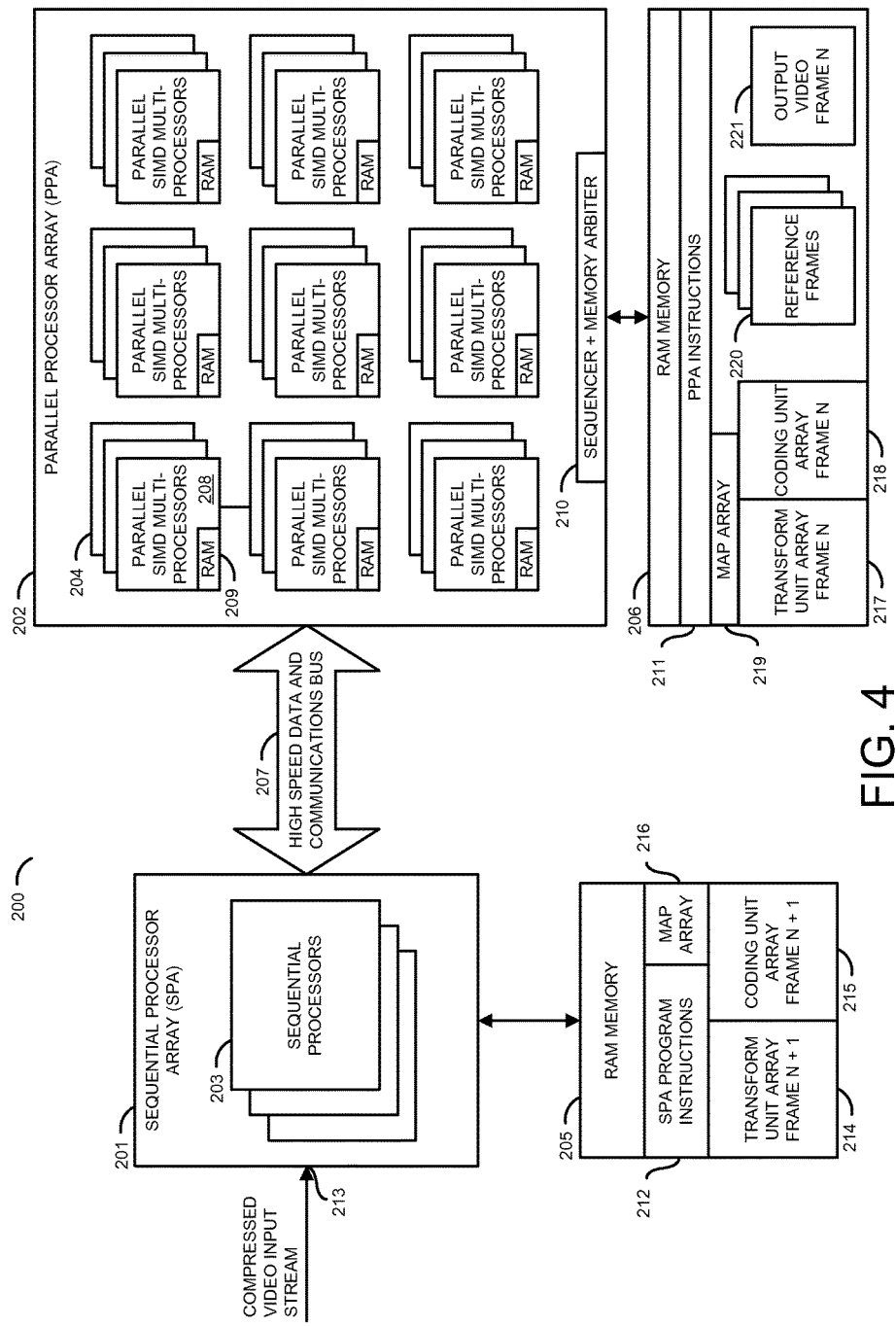
FIG. 4 is a diagram illustrating a multi-processor video decompression/compression system architecture in accordance with an embodiment of the present invention.

Referring to FIG. 4, a diagram is shown illustrating a system architecture 200 in accordance with an embodiment of the invention. In various embodiments of the invention, the architecture 200 may comprise a sequential processor array (SPA) 201 and a parallel processor array (PPA) 202. The SPA 201 may contain one or more high performance general purpose sequential processing units 203 that are designed to execute sequential instructions on sequential data. The PPA 202 may contain one or more groups of homogeneous general purpose SIMD multiprocessors 204 that are designed to operate on highly parallel problems where many processors can work in parallel. The SPA 201 and PPA 202 each have access to one or more physical random access memories (RAMs) 205 and 206, respectively, and may be connected together (e.g., via a high speed bi-directional data and communication bus 207).

Each multiprocessor 204 may contain one or more SIMD (Single Instruction Multiple Data) processors 208, and also may contain a memory cache (illustrated as RAM but may be other types of cache) 209. The memory cache 209 generally allows fast access and communication between each SIMD processor 208 in the multiprocessor 204. The random access memory (RAM) 206 is generally shared by all the multiprocessors 204 in the array 202. The random access memory (RAM) 206 may be configured to store video frames, block coefficient data, block metadata, scheduling information, and multiprocessor instructions. A PPA sequencer and memory arbiter 210 may be configured to automatically and efficiently select processors in the array 202 (e.g., GPU blocks) to execute a set of instructions 211 stored in the memory 206. The processors in the array 202 may be configured to execute the set of instructions 211 based upon a schedule also stored in the memory 206. Each multiprocessor 204 may process batches of instructions 211. In one example, one batch may be executed after another. The PPA sequencer and memory arbiter 210 selects batches of instructions 211 for each multiprocessor 204. If, and when, a multiprocessor 204 is instructed to wait for memory or a synchronization event, the PPA sequencer and memory arbiter 210 may be configured to swap in new instructions to execute on that multiprocessor 204.

The processors 203 are generally controlled using program instructions 212 stored in the memory 205. Compressed video 213 is syntax decoded by the SPA 201, using one or more sequential processors 203. When compressed video 213 comprises an HEVC bit stream, syntax decoding of the compressed video 213 creates transform unit data 214, coding unit data 215, and map array data 216. In some embodiments, after the syntax decoding is finished, a sequential processor 203 scans the transform unit data 214 and the coding unit data 215 and creates (populates) the map array 216. In other embodiments, the map array 216 may be created at the same time as the syntax decoding is performed. When the syntax decoding for a frame is completed, the transform unit array 214, the coding unit array 215, and the map array 216 for the frame are transferred to the PPA 202 using the high speed data bus 207. The transferred transform unit array 214, the coding unit array 215, and the map array 216 are stored in memories 217, 218 and 219, respectively.

GPU blocks are then run on the multiprocessors 204, as launched by the sequencer and memory arbiter 210. The GPU blocks read in data from the transform unit array and coding unit array in the memories 217 and 218 using the map array in the memory 219 and the sequencer and memory arbiter 210. The data are stored temporarily in the local memory 209. The GPU blocks then decompress the data (e.g., using one or more reference frames 220 stored in the memory 206). If a GPU block needs to wait for data from neighbor blocks, the GPU block waits on a synchronization primitive (e.g., continuing to check the memory 206 to see if a GPU block has indicated it is finished). When the GPU block is finished, the GPU block writes the reconstructed data to a memory 221 and writes metadata to indicate it is finished.

Figure 5:
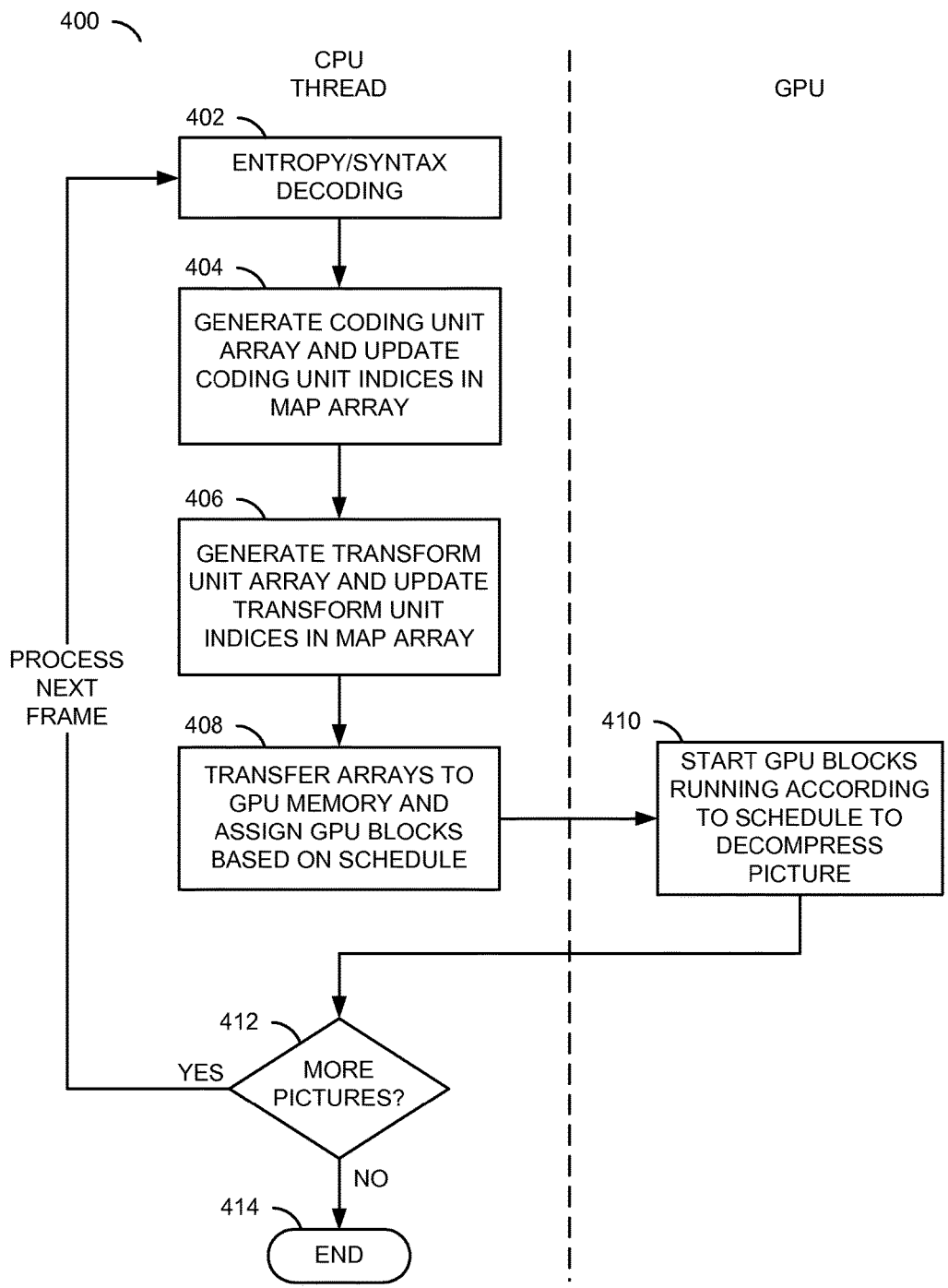
FIG. 5 is a flow diagram illustrating an example partition of a decoder functionality across sets of parallel and serial processors in accordance with an embodiment of the present invention.

Referring to FIG. 5, a flow diagram is shown illustrating an example decoding process 400 in accordance with an embodiment of the invention. In one example, the process (or method) 400 may implement a block-based decoder using multiple GPU and CPU threads. The block-based decoder may be compliant with one or more standard and/or proprietary codecs (e.g., H.264, H.HEVC, etc.). In some embodiments, the process 400 may comprise a step (or state) 402, a step (or state) 404, a step (or state) 406, a step (or state) 408, a step (or state) 410, a step (or state) 412, and a step (or state) 414. Each of the steps 402-414 may be implemented as a step, a process, a subroutine, a state in a state machine/diagram, or another type of step/state and/or process and/or state.

The process 400 generally begins processing a frame in the step 402. The frame may be partitioned as a picture, one or more slices, tiles, etc. Embodiments of the present invention may support various features of HEVC that facilitate parallel processing. For example, encoders and/or decoders may include support for slice processing, tile processing, wavefront parallel processing, and dependent slice processing. In the step 402, the process 400 performs entropy/syntax decoding. In the step 404, the process 400 generates a coding unit array and updates coding unit indices in a map array. The process 400 then moves to the step 406. In the step 406, the process 400 generates a transform unit array and updates transform unit indices in the map array. In one example, the steps 402-406 may be performed as separate passes (e.g., sequentially in a single CPU thread). In another example, the steps 402-406 may be performed concurrently (e.g., in separate CPU threads). When the coding unit array, the transform unit array and the map array are completed, the process 400 moves to the step 408. In the step 408, the process 400 transfers the map array, the coding unit array, and the transform unit array to the memory of the parallel processing unit. The process 400 may also transfer scheduling information that may be used to assign blocks of the parallel processing unit.

In the step 410, the GPU assigns blocks of one or more processors (GPU blocks) based upon the scheduling information and begins running the GPU blocks to decompress (reconstruct) the compressed picture. While the GPU is running the GPU blocks, the process 400 may move to the step 412 in the CPU thread, where a check is performed to determine whether there are more pictures, slices, tiles, etc. to reconstruct. If there are more pictures, slices, tiles, etc., the process 400 moves to the step 402 (or the step 404 if the step 402 is implemented in a separate CPU thread) to begin creating arrays for the next picture. If there are no more pictures, the process 400 moves to the step 414 and terminates. The step 410 for the current picture can generally run in parallel with the step 412 and the steps 402-406 for the next picture.

Figure 6:
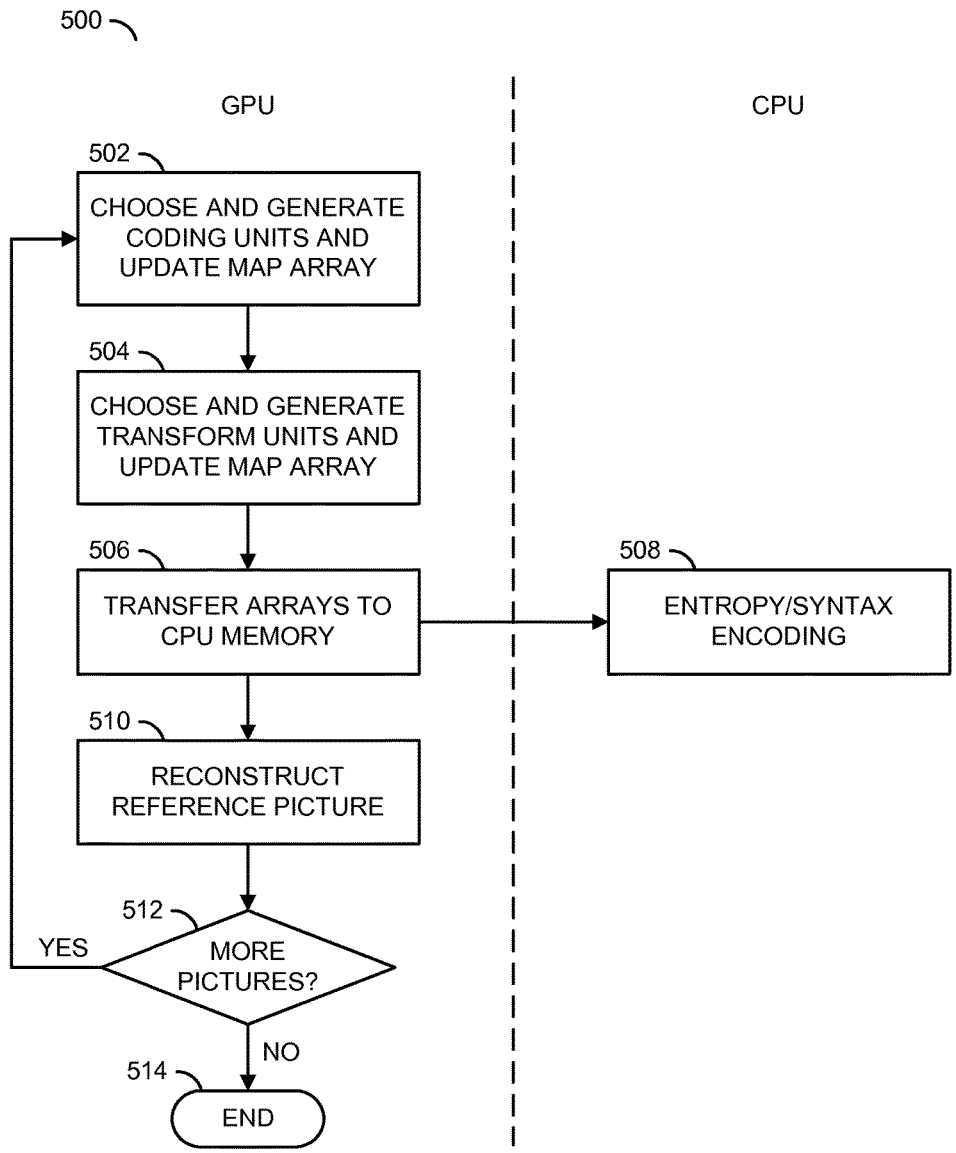
FIG. 6 is a flow diagram illustrating an example partition of an encoder functionality across sets of parallel and serial processors in accordance with another embodiment of the present invention.

Referring to FIG. 6, a flow diagram is shown illustrating an example HEVC compliant encoding process 500 in accordance with an embodiment of the present invention. In one example, the process (or method) 500 may implement a block-based encoder using PPU and CPU threads. The block-based encoder may be compliant with one or more standard and/or proprietary codecs (e.g., H.264, H.HEVC, etc.). In some embodiments, the process 500 may comprise a step (or state) 502, a step (or state) 504, a step (or state) 506, a step (or state) 508, a step (or state) 510, a step (or state) 512, and a step (or state) 514. Each of the steps 502-514 may be implemented as a step, a process, a subroutine, a state in a state machine/diagram, or another type of step/state and/or process and/or state.

The process 500 generally begins processing (encoding) a picture in the step 502 (e.g., in a PPU thread). In the step 502, the process 500 selects a coding tree unit (CTU), then chooses and generates coding units (CUs). Using indices from a coding unit array containing the CUs generated, the process 500 updates a map array. The process 500 then moves to the step 504. In the step 504, the process 500 chooses and generates transform units (TUs) and updates the map array with the indices from the transform unit array containing the TUs generated. The process 500 then moves to the step 506.

In the step 506, the process 500 transfers the coding unit array, the transform unit array, and the map array generated in the previous steps to the memory of the central processing unit. Once the arrays have been transferred to the memory of the central processing unit, the process 500 begins performing the step 508 in a CPU thread and the step 510 in the GPU thread. In the step 508, the process 500 performs an entropy/syntax encoding process. While the CPU is performing the entropy/syntax encoding process, in the step 510 the process 500 reconstructs a reference picture using the coding units, transform units and map array previously generated. Once the reference picture has been reconstructed, the process 500 moves to the step 512. In the step 512, the process 500 determines whether more pictures remain to be encoded. If so, the process 500 returns to the step 502 to begin coding the next picture. Otherwise, the process 500 moves to the step 514 and terminates. The step 510 for the current picture can generally run in parallel (concurrently) with the step 512 and the steps 502-506 for the next picture.

Figure 7:
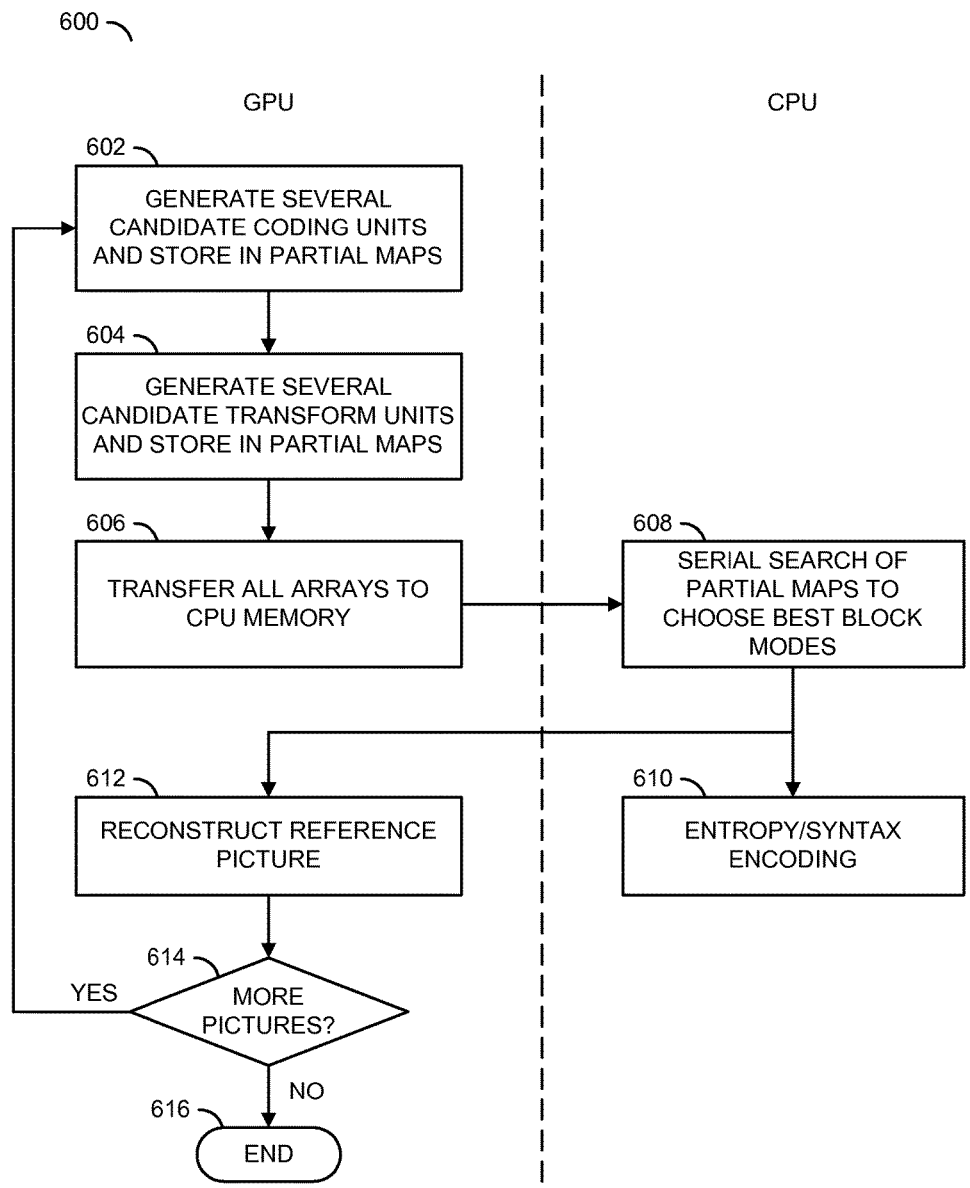
FIG. 7 is a flow diagram illustrating another example partition of an encoder functionality across sets of parallel and serial processors in accordance with still another embodiment of the present invention.

Referring to FIG. 7, a flow diagram is shown illustrating an example HEVC compliant encoding process 600 in accordance with another embodiment of the invention. In one example, the process (or method) 600 may implement a block-based encoder using PPU and CPU threads. The block-based encoder may be compliant with one or more standard and/or proprietary codecs (e.g., H.264, H.HEVC, etc.). In some embodiments, the process 600 may comprise a step (or state) 602, a step (or state) 604, a step (or state) 606, a step (or state) 608, a step (or state) 610, a step (or state) 612, a step (or state) 614, and a step (or state) 616. Each of the steps 602-616 may be implemented as a step, a process, a subroutine, a state in a state machine/diagram, or another type of step/state and/or process and/or state.

The process 600 generally begins encoding a picture in the step 602 (e.g., in a GPU thread). In the step 602, the process 600 selects a coding tree unit (CTU) and generates several candidate coding units. The candidate coding units are stored in partial maps. The process 600 then moves to the step 604. In the step 604, the process 600 generates several candidate transform units and stores the candidate transform units in partial maps. The process 600 then proceeds to the step 606, where the partial maps (e.g., coding unit arrays, transform unit arrays, map arrays) generated in the steps 602 and 604 are transferred to a memory of the central processing unit. The process 600 then moves to the step 608, which is part of a CPU thread. The process 600 performs a serial search of the partial maps to choose the best block modes. The process 600 then moves to the step 610 in the CPU thread and the step 612 in the GPU thread. In the step 610, the process 600 performs entropy/syntax encoding using the CPU. Concurrently, in the step 612 of the GPU thread, the process 600 reconstructs a reference picture. When the reference picture has been reconstructed, the process 600 moves to the step 614 in the GPU thread, where a determination is made whether more pictures remain to be encoded. If more pictures remain to be encoded, the process 600 returns to the step 602. Otherwise the process 600 moves to the step 616 and terminates. The step 610 for the current picture can generally run in parallel (concurrently) with the step 612, the step 614, and the steps 602-606 for the next picture.

The functions performed by the various kernels, subroutines, programs, processes, steps, etc. described above and illustrated in the diagrams of FIGS. 5-7 may be implemented using a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), graphics processing unit (GPU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products) or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (electronically programmable ROMs), EEPROMs (electronically erasable ROMs), UVPROM (ultra-violet erasable ROMs), Flash memory, magnetic cards, optical cards, and/or any type of media suitable for storing electronic instructions.

While the present invention has been particularly shown and described with reference to the preferred embodiments thereof, it will be understood by those skilled in the art that various changes in form and details may be made without departing from the scope of the present invention.

The invention claimed is:

1. An apparatus comprising:
    a central processing unit; and
    a parallel processing unit comprising
    an array of software-configurable general purpose processors,
    a globally-shared memory, wherein each of the software-configurable general purpose processors in said array of software-configurable general purpose processors has access to said globally-shared memory to execute one or more portions of at least one of (i) a decoding program, (ii) an encoding program, and (iii) an encoding and decoding program, and
    a shared memory, wherein said shared memory is accessible by said central processing unit to program said shared memory with:
        a transform unit array comprising a plurality of transform units arranged in arbitrary order, an individual transform unit of the transform unit array including a transform setting;
        a coding unit array comprising a plurality of coding units arranged in arbitrary order, an individual coding unit of the transform unit array including a coding mode; and
        a map array comprising a plurality of map elements, an individual map element of the plurality of map elements representing a block of image pixels and including indices specifying which transform unit of the transform unit array and which coding unit of the coding unit array apply to the block of image pixels, wherein the transform unit array, the coding unit array, and the map array are packed into a contiguous region of the shared memory and transform units of the transform unit array and coding units of the coding unit array are accessible based on the map array without order dependencies or serialization requirements.

2. The apparatus according to claim 1, wherein said at least one of (i) the decoding program, (ii) the encoding program, and (iii) the encoding and decoding program, when executed by said parallel processing unit, reconstructs a current frame using indices in said map array and one or more reference frames, and said current frame and said one or more reference frames are stored in said globally-shared memory.

3. The apparatus according to claim 2, wherein the decoding program, the encoding program, and the encoding and decoding program are configured to (i) decode pictures, (ii) encode pictures, and (iii) encode and decode pictures, respectively, in compliance with one or more standard or proprietary codecs.

4. The apparatus according to claim 3, wherein said one or more standard or proprietary codecs comprise High Efficiency Video Coding (HEVC).

5. The apparatus according to claim 1, wherein the array of software-configurable general purpose processors is part of a graphics processing unit.

6. The apparatus according to claim 1, wherein said map array is generated during encoding or decoding of a picture.

7. The apparatus according to claim 6, wherein the map array is generated by the central processing unit during decoding and by the parallel processing unit during encoding.

8. The apparatus according to claim 7, wherein the map array indicates which blocks of an array of coding units and which blocks of an array of transform units correspond to pixels associated with each element of the map array.

9. The apparatus according to claim 1, wherein each of said software-configurable general purpose processors comprises one or more single instruction multiple data (SIMD) processors.

10. The apparatus according to claim 1, wherein the map array, transform unit array, and coding unit array are stored in a contiguous portion of the shared memory.

11. A method comprising:
    providing a central processing unit;
    providing a parallel processing unit comprising:
        an array of software-configurable general purpose processors,
        a globally-shared memory, wherein each of the software-configurable general purpose processors in said array of software-configurable general purpose processors has access to said globally-shared memory to execute one or more portions of at least one of (i) a decoding program, (ii) an encoding program, and (iii) an encoding and decoding program, and
        a shared memory, wherein said shared memory is accessible by said central processing unit to program said shared memory with
            a transform unit array comprising a plurality of transform units arranged in arbitrary order, an individual transform unit of the transform unit array including a transform setting;

a coding unit array comprising a plurality of coding units arranged in arbitrary order, an individual coding unit of the transform unit array including a coding mode; and a map array comprising a plurality of map elements, an individual map element of the plurality of map elements representing a block of image pixels and including indices specifying which transform unit of the transform unit array and which coding unit of the coding unit array apply to the block of image pixels, wherein the transform units of the transform unit array and coding units of the coding unit array are accessible based on the map array without order dependencies or serialization requirements; and storing the map array, the transform unit array, and the coding unit array in the shared memory.

12. The method of claim 11, wherein storing the map array in the shared memory further comprises:
storing the map array, transform unit array, and coding unit array in a contiguous portion of the shared memory.

13. The method of claim 11, further comprising:
reconstructing a current frame using indices in said map array and one or more reference frames, wherein the current frame and the one or more reference frames are stored in said globally-shared memory.

14. The method of claim 11, further comprising:
generating the map array by the central processing unit during decoding; and
generating the map array by the parallel processing unit during encoding.

15. The method of claim 14, wherein the map array indicates which blocks of an array of coding units and which blocks of an array of transform units correspond to pixels associated with each element of the map array.

* * * * *